United States Patent
Tsai et al.

(10) Patent No.: US 6,924,204 B2
(45) Date of Patent: Aug. 2, 2005

(54) SPLIT GATE FLASH MEMORY CELL AND MANUFACTURING METHOD THEREOF

(75) Inventors: Tzu-Ching Tsai, Taoyuan (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 22 days.

(21) Appl. No.: 10/605,304

(22) Filed: Sep. 22, 2003

(65) Prior Publication Data

US 2005/0037567 A1 Feb. 17, 2005

(30) Foreign Application Priority Data

Aug. 12, 2003 (TW) .......................... 92122059 A

(51) Int. Cl.⁷ .......................................... H01L 21/8242
(52) U.S. Cl. ...................... 438/386; 438/249; 438/392; 438/561; 438/563
(58) Field of Search ................. 438/563, 660, 438/680, 914, 923, 958, 961, FOR 220, FOR 407, FOR 430, FOR 212, 243, 244, 246, 249, 386, 387, 389, 392, 396, 522, 524, 530, 542, 561

(56) References Cited

U.S. PATENT DOCUMENTS

| | | | | |
|---|---|---|---|---|
| 5,360,758 A | * | 11/1994 | Bronner et al. ............. | 438/243 |
| 5,521,111 A | * | 5/1996 | Sato ............................. | 438/244 |
| 5,677,228 A | * | 10/1997 | Tseng ........................... | 438/238 |
| 5,795,804 A | * | 8/1998 | Jenq ............................ | 438/244 |
| 6,455,369 B1 | * | 9/2002 | Forster et al. ............... | 438/249 |
| 6,506,655 B1 | * | 1/2003 | Gris et al. ................... | 438/309 |
| 6,518,118 B2 | * | 2/2003 | Athavale et al. ............ | 438/243 |
| 2002/0066917 A1 | * | 6/2002 | Jaiprakash et al. .......... | 257/301 |
| 2003/0153158 A1 | * | 8/2003 | Ho et al. ..................... | 438/386 |
| 2004/0214390 A1 | * | 10/2004 | Chen et al. .................. | 438/423 |

* cited by examiner

Primary Examiner—George Fourson
Assistant Examiner—Joannie Adelle Garcia
(74) Attorney, Agent, or Firm—Jianq Chyun IP office

(57) ABSTRACT

A method for fabricating a buried plate of a deep trench capacitor is described. A substrate having a deep trench therein is provided. A doped layer is formed on the surface of the deep trench and a material layer is formed on the doped layer. A passivation layer is formed on the sidewall of the deep trench that is not covered by the material layer. After removing the material layer, a thermal process is conducted to drive-in the dopants in the doped layer to the substrate to form a doped region, wherein the doped region serves as a buried plate of the deep trench capacitor. The doped layer also reacts with the substrate to form an oxide layer. After removing the oxide layer, a bottle-shaped deep trench is formed.

20 Claims, 5 Drawing Sheets

SPLIT GATE FLASH MEMORY CELL AND MANUFACTURING METHOD THEREOF

CROSS REFERENCE TO RELATED APPLICATIONS

This application claims the priority benefit of Taiwan application serial no. 92122059, filed on Aug. 12, 2003.

BACKGROUND OF INVENTION

1. Field of the Invention

The present invention relates to a fabrication method for a capacitor. More particularly, the present invention relates to a buried plate of a deep trench capacitor.

2. Description of Related Art

As semiconductor devices enter the deep sub-micron processing, the device dimension gradually reduces. For a dynamic random access memory (DRAM) device, the area for forming the capacitor also diminishes. On the other hand, as the application of software increases, the memory capacity required by a memory device gradually increases. When the demands on a smaller device dimension and a larger memory capacity become higher, it is obvious that the fabrication method for a capacitor of a DRAM device needs to be modified.

The structure of a DRAM capacitor is mainly divided into two types. One type is the stack capacitor, while the other is the deep trench capacitor. For a deep trench capacitor, increasing the capacitance of the capacitor within a limited area can be achieved by increasing the contact area of the electrode. Therefore, a bottle-shaped deep trench structure is typically used in a deep trench capacitor. Since the bottle-shaped deep trench can increase the area of the buried plate, the capacity of the capacitor also increases.

FIGS. 1A to 1E are schematic, cross-sectional view diagrams illustrating the process flow for fabricating a buried plate of a deep trench capacitor.

Referring to FIG. 1A, a substrate 100 is provided, wherein a patterned mask layer 101 is formed on the substrate 100. The mask layer 101 comprises an opening which exposes a surface of the substrate 100. Using the mask layer 101 as an etching mask, an etching is conducted to pattern the substrate 100 to form a deep trench 102. An oxide layer 104 is further formed on the surface of the deep trench 102, except the top part of the trench 102. A nitridation process is subsequently conducted to form a silicon nitride layer 106 on the surface of the exposed substrate 100 in the deep trench 102.

Referring to FIG. 1B, the oxide layer 104 is removed. Thereafter, wet etching is conducted to form a bottle-shaped deep trench 102a, wherein the part of the sidewall of the deep trench that is covered with a silicon nitride layer 106 is precluded from being wet etched.

Continuing to FIG. 1C, the silicon nitride layer 106 is then removed. A conformal doped layer 108 is formed on the surface of the substrate 100 and on the surface of the deep trench 102a. A deep trench 102a is then filled with a photoresist layer 110, covering the doped polysilicon layer 108, wherein the photoresist layer 110 does not completely fill the deep trench 102a.

Referring to FIG. 1D, the conformal doped layer 108, not covered by the photoresist layer is removed, leaving the doped layer 108a at the bottom of the deep trench 102a. The photoresist layer 110 is subsequently removed. A thermal process is further conducted to drive in the dopants in the doped layer 108a into the substrate 100 to form a doped region 112, wherein the doped region 112 serves as the buried plate of the deep trench capacitor. Thereafter, the doped layer 108a in the deep trench 102a is removed as shown in FIG. 1E to complete the fabrication of a buried plate of a deep trench capacitor.

In accordance to the above fabrication method, to complete the fabrication of a deep trench with a bottle shape structure requires multiple processing steps. Further, the bottle shape structure and the doped region (buried plate) are formed in different process steps. Therefore, the conventional fabrication process is very time-consuming. Moreover, the uniformity of the thickness of the photoresist layer, which is used to control the dimension of the buried plate, is difficult to control during the fabrication process. Consequently, the capacitance of the capacitor in the memory devices is not consistent. Further, forming the silicon nitride layer on the sidewall surface of the substrate is accomplished through a nitridation reaction. However, the desired thickness of the silicon nitride layer is difficult to control through a nitridation reaction. As a result, the silicon nitride layer formed according to the prior art is not effective in preventing the erosion of the etchant.

SUMMARY OF INVENTION

Accordingly, the present invention provides a fabrication method for a buried plate of a deep trench capacitor, wherein a non-uniform thickness of the photoresist, which is used to control the area of the buried plate, as in the prior art is obviated. Consequently, the area of the buried plate of the capacitor being inconsistent is prevented.

The present invention also provides a fabrication method for a buried plate of a deep trench capacitor for resolving the problem of an inadequate thickness of the silicon nitride layer formed on the sidewall surface of the substrate by the conventional nitridation reaction, wherein the inadequate thickness of the silicon nitride layer fails to obstruct the erosion of the etchant.

The present invention further provides a fabrication method for a buried plate of a deep trench capacitor for reducing the processing steps.

The present invention provides a fabrication method for a buried plate of a deep trench capacitor, wherein a deep trench is first formed in the substrate. A conformal dope layer is formed on the substrate and the surface of the deep trench. The deep trench is then filled with a material layer, for example, a polysilicon material, wherein the material layer does not fill the trench completely. The conformal doped layer that is not covered by the material layer is removed. A deposition process is conducted on the substrate and the surface of the trench to form a conformal passivation layer, wherein the passivation layer is, for example, silicon nitride. The conformal passivation layer is etched back to form a passivation layer on the sidewall of the deep trench that is not covered by the material layer. The material layer is subsequently removed. Thereafter a thermal process is conducted to drive-in the dopants in the doped layer into the substrate to form a doped region. Concurrently, the doped layer would react with the substrate to form an oxide layer, wherein the doped region can serve as the buried plate of the deep trench capacitor.

Since the conventional photoresist layer is replaced by a polysilicon layer to control the dimension of the buried plate, the problem of having a non-uniform thickness in the photoresist layer as in the prior art is prevented. As a result, an inconsistency in the dimension of the buried plate can also be avoided.

Further, the passivation layer is formed on the sidewall of the deep trench via a deposition process. The problem of having an inadequate thickness in the silicon nitride layer formed according to the conventional nitridation process, leading to a deficiency in preventing the erosion of the etchant is resolved.

Further, in accordance to the fabrication method of the present invention, the buried plate of the deep trench capacitor and the bottle-shaped deep trench structure for increasing the capacitance are concurrently formed to reduce the manufacturing time and to simplify the fabrication process.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

FIGS. 2A to 2H are schematic, cross-sectional view diagrams illustrating the process flow for fabricating a buried plate of a deep trench capacitor according to one aspect of the present invention.

Figure 1A:
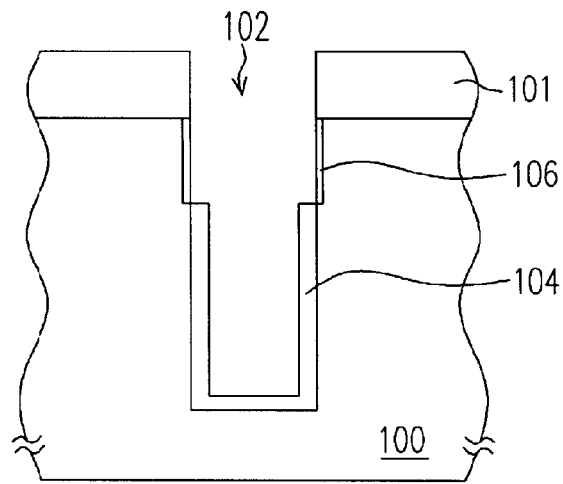
FIGS. 1A to 1E are schematic, cross-sectional view diagrams illustrating the process flow for fabricating a buried plate of a deep trench capacitor according to the prior art.
Figure 1B:
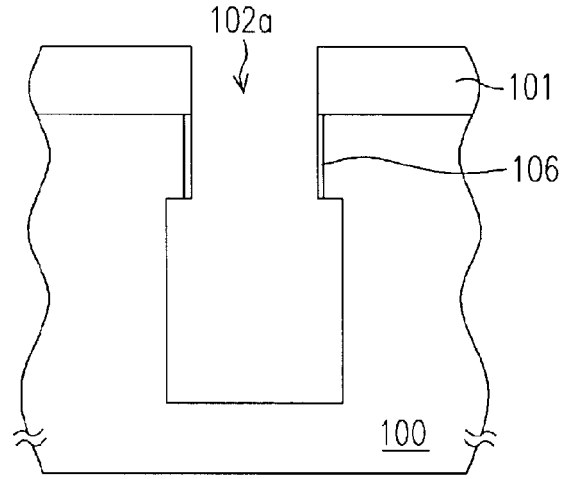
Figure 1C:
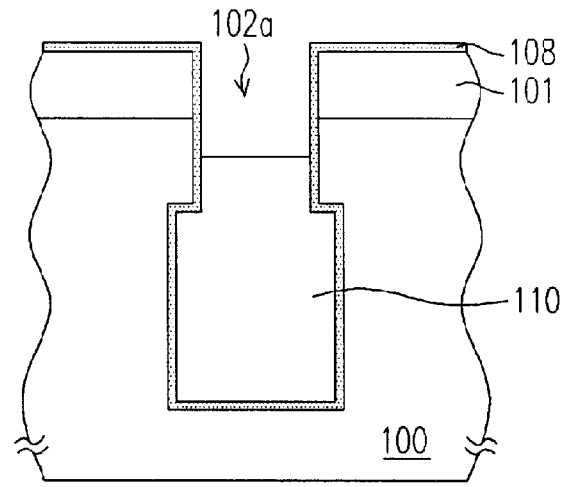
Figure 1D:
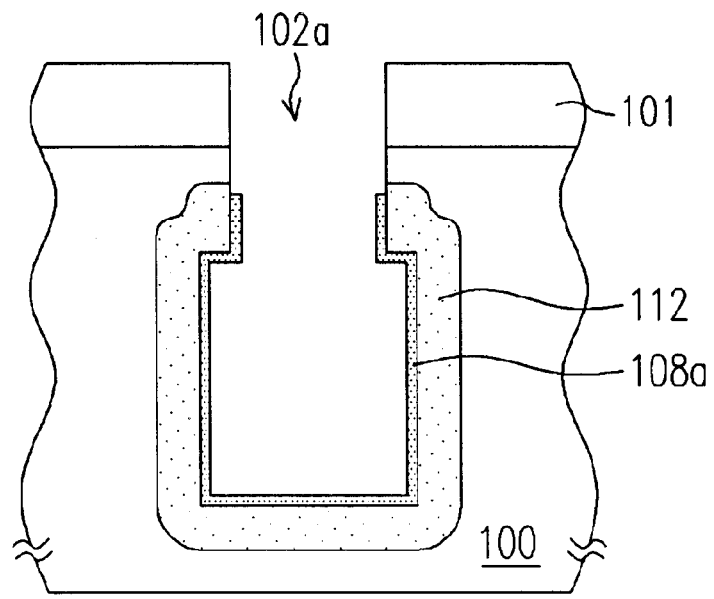
Figure 1E:
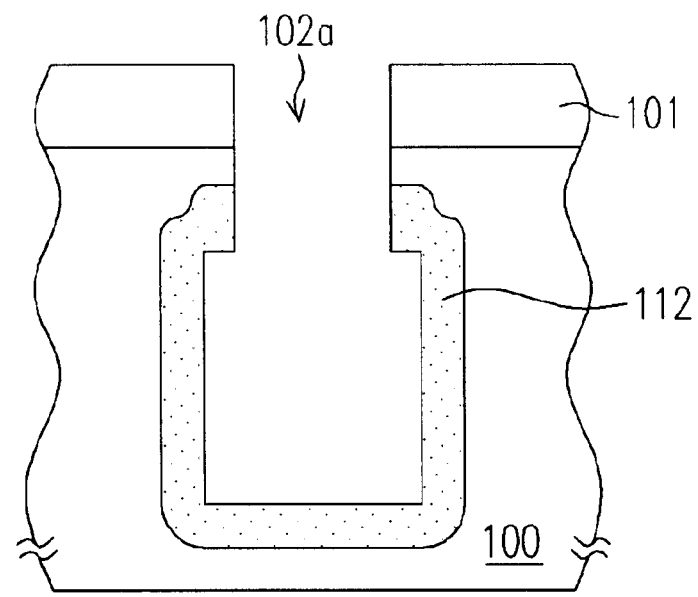
Figure 2A:
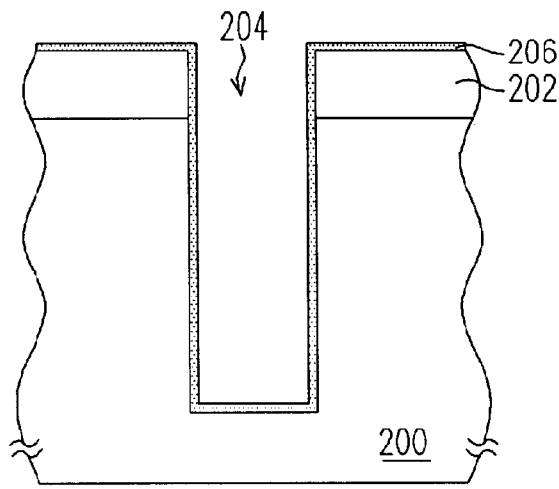
FIGS. 2A to 2H are schematic, cross-sectional view diagrams illustrating the process flow for fabricating a buried plate of a deep trench capacitor according to an aspect of the present invention.

Referring to FIG. 2A, a substrate 200 is provided. A patterned mask layer 202 is formed on the substrate 200, wherein the mask layer 202 is, for example silicon nitride. The mask layer 202 comprises an opening, which exposes the surface of the substrate. In one aspect of the invention, a pad oxide layer (not shown) can also be formed between the mask layer 202 and the substrate 200 to protect the surface of the substrate 200. Thereafter, the mask layer 202 is used as an etching mask to perform an etching process in which the substrate 200 is patterned to form a deep trench 204. The etching process includes, for example, a dry etching process. A conformal doped layer 206 is formed on the surface of the deep trench 204 and the mask layer 202, wherein the doped layer 206 is, for example, a silicate glass layer doped with arsenic ions, formed by, for example, a chemical vapor deposition method.

Figure 2B:
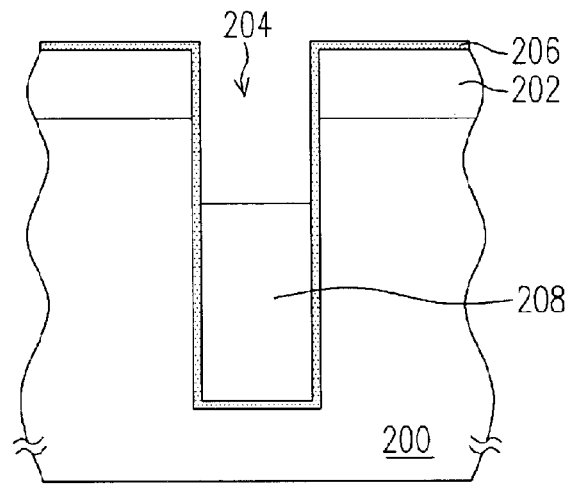
Figure 2C:
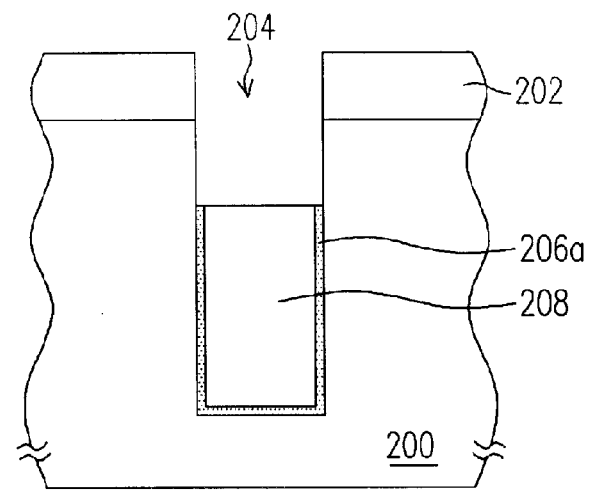

Referring to both FIGS. 2B and 2C, the deep trench 204 is filled with a material layer 208, covering a portion of the doped layer 206, wherein the material layer 208 does not completely fill the deep trench 204. The doped layer 206 not covered by the material layer 208 is removed to form the doped layer 206a. Forming the material layer 208 includes performing chemical vapor deposition to form a material layer (not shown) on the mask layer 202 and inside the deep trench, followed by removing a portion of the material layer to leave only the material layer inside the deep trench 204. The material layer is, for example, polysilicon. Thereafter, the conformal doped layer not covered by the material layer 208 is removed, for example, by a wet etching process, to form the doped layer 206a.

Figure 2D:
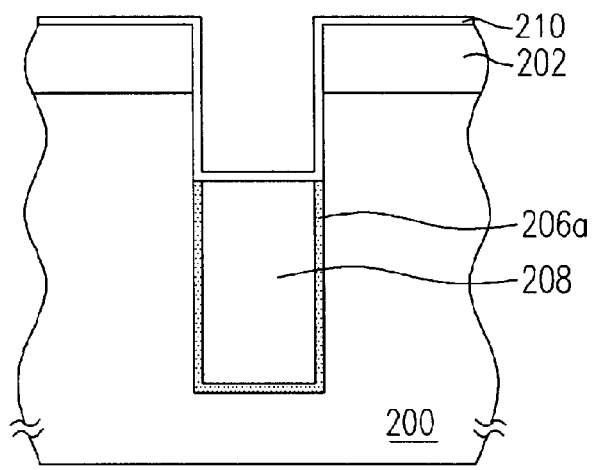

Referring to FIG. 2D, a conformal passivation layer 210 is formed on the surfaces of the mask layer 202 and the material layer 208, wherein the passivation layer 210 is, for example, silicon nitride. Forming the conformal passivation layer includes, performing chemical vapor deposition. Further, the conformal passivation layer 210 is formed with a thickness of about 150 angstroms to about 200 angstroms.

Figure 2E:
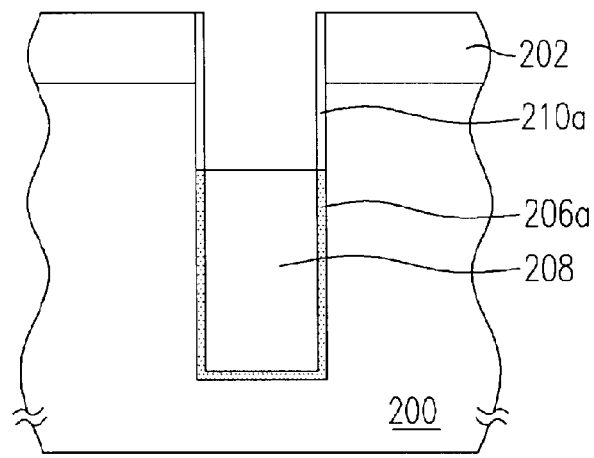
Figure 2F:
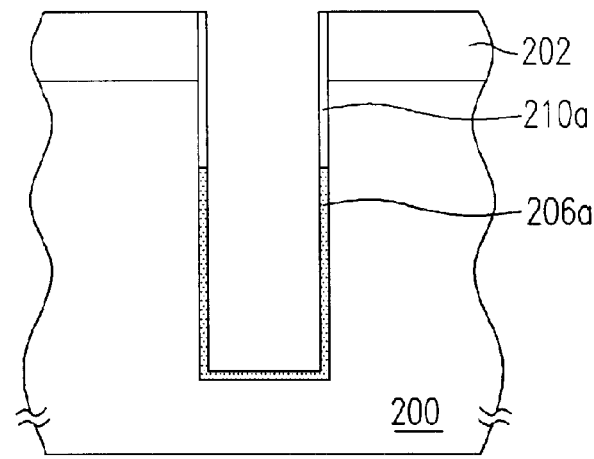

Referring to both FIGS. 2E and 2F, the conformal passivation layer 210 is etched back to expose the surface of the material layer 208 to form the passivation layer 210a. The etching back of the conformal passivation layer includes performing a dry etching process. The material layer 208 on the doped layer 206a is then removed, for example, by a wet etching process.

Figure 2G:
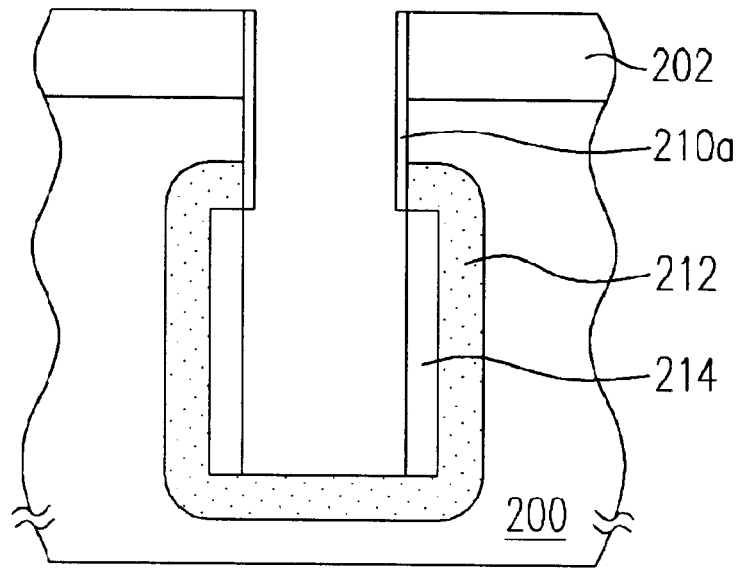

Continuing to FIG. 2G, a thermal process is conducted. Due to the high temperature, dopants in the doped layer 206a diffused to the substrate 200 to form the doped region 212. Concurrently, the doped layer 206a would react with the substrate 200 to form an oxide layer 214. The thermal process is conducted under, for example, an oxygen gas, wherein the flow rate of the oxygen gas is about 10 to 50 liter/min. Further, the thermal process is conducted at about 700 to about 1000 degrees Celsius. The duration of the thermal process is about 10 to 30 minutes. Further, the consumption of the substrate 200 is about 180 angstroms to about 200 angstroms thick when the substrate 200 reacts with the doped layer 206a to form the oxide layer 214. The aforementioned doped region 212 is subsequently served as the buried plate of the deep trench capacitor.

Figure 2H:
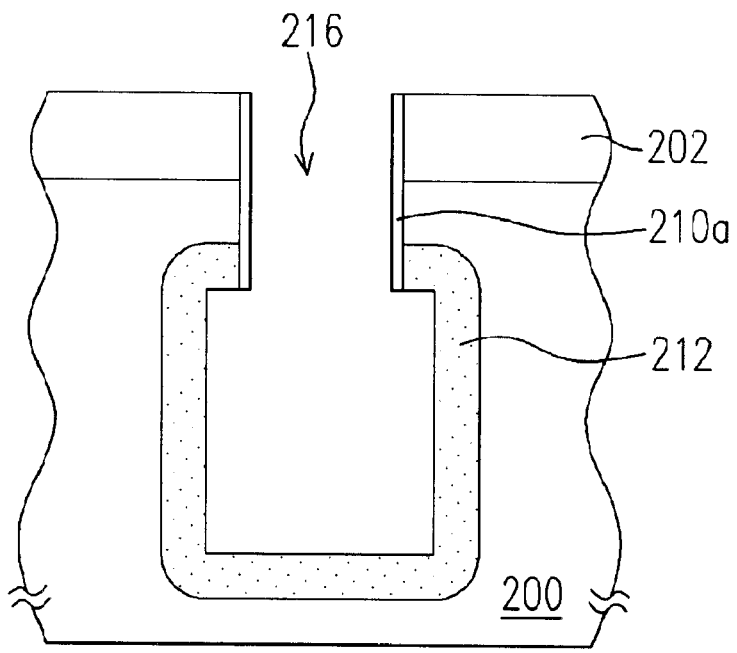

Thereafter, as shown in FIG. 2H, the oxide layer 214 is removed to form a bottle-shaped deep trench 216. A buried plate of a deep trench capacitor is also formed in the substrate 200 adjacent to the bottle-shaped deep trench 216.

The subsequent manufacturing process of the present invention further includes forming sequentially a dielectric layer and an electrode layer in the deep trench, wherein the electrode layer, the dielectric layer and the buried plate together complete the formation of a deep trench capacitor. Beside, a conductive layer can be further used to electrically connect the capacitor and the transistor on the substrate to form a memory cell of a dynamic random access memory device.

In accordance to the fabrication method of the present invention, a polysilicon material layer is used in the place of the conventional photoresist layer to control the dimension of the buried plate. An advantage of using a polysilicon material is its thickness is easily controlled. Therefore a non-uniformity in the thickness of the photoresist layer leading to inconsistency in the dimension of the buried layer and in the capacitance of the capacitor as commonly occurred in the prior art is prevented.

Further, the passivation layer formed on the sidewall of the deep trench is thicker by a chemical vapor deposition method than a nitridation method. Therefore, the problem of an insufficient thickness of the passivation formed by a nitridation method, leading to the incapability of resisting the etchant during the etching process is obviated.

Further, a large quantity of oxygen gas is used in the thermal process to conduct the dopant diffusion and to form the oxide layer concurrently. Therefore, after the oxide layer is removed, a bottle-shaped deep trench can be formed. The present invention can thereby complete the formation of a bottle-shaped deep trench structure and a buried plate of a deep trench capacitor at the same time. As a result, the manufacturing process is simplified and the manufacturing time is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a buried plate of a deep trench capacitor, comprising:
   providing a substrate, wherein the substrate is already formed with a deep trench;
   forming a doped layer on a surface at a bottom of the deep trench and forming a material layer on the doped layer;
   forming a passivation layer an a sidewall of the deep trench that is not covered by the material layer;
   removing the material layer;
   performing a thermal process to drive-in dopants in the doped layer to the substrate to form a doped region and concurrently inducing a reaction between the doped layer and the substrate to form an oxide layer; and
   removing the oxide layer.

2. The fabrication method of claim 1, wherein the thermal process comprises using an oxygen gas, wherein a flow rate of the oxygen gas is about 10 to 50 liter/minute.

3. The fabrication method of claim 1, wherein the thermal process is conducted at a temperature of about 700 degrees to 1000 degrees Celsius.

4. The fabrication method of claim 1, wherein the thermal process is conducted for about 10 to about 30 minutes.

5. The fabrication method of claim 1, wherein forming the passivation layer on the sidewall of the deep bench that is not covered by the material layer further comprises:
   forming a conformal passivation layer above the substrate and on the surface of the deep trench, covering the material layer and the doped layer; and
   etching back the conformal passivation layer to form the passivation layer on the sidewall of the deep trench that is not covered by the material layer.

6. The fabrication method of claim 5, wherein forming the conformal passivation layer comprises performing a deposition process.

7. The fabrication method of claim 1, wherein the passivation layer is formed with a material that includes silicon nitride.

8. The fabrication method of claim 1, wherein the passivation layer is about 150 angstroms to about 200 angstroms thick.

9. The fabrication method of claim 1, wherein the substrate that is being consumed during the reaction between the doped layer and the substrate is about 150 angstroms to about 200 angstroms thick.

10. The fabrication method of claim 1, wherein forming the doped layer on the surface at the bottom of the deep trench and forming the material layer on the doped layer further comprises
    forming a conformal doped layer above the substrate and on the surface of the deep trench;
    filling the material layer in the deep trench, wherein the material layer does not completely fill the deep trench; and
    removing the conformal doped layer that is not covered by the material layer.

11. The fabrication method of claim 1, wherein the material layer comprises polysilicon.

12. The fabrication method of claim 1, wherein the doped layer comprises a silicate glass layer doped with arsenic ions.

13. A fabrication method for a buried plate of a deep trench capacitor, comprising:
    providing a substrate having a deep trench already formed therein;
    forming a doped layer on a bottom surface of the trench;
    forming a passivation layer on a sidewall at a top of the deep trench;
    performing a thermal process to drive-in dopants in the doped layer to the substrate to form a doped region and concurrently inducing a reaction between the doped layer and the substrate to form an oxide layer; and
    removing the oxide layer.

14. The method of claim 13, wherein the thermal process is conducted with an oxygen gas, wherein a flow rate of the oxygen gas is about 10 to 50 liter/minute.

15. The method of claim 13, wherein the thermal process is conducted at about 700 degrees to 1000 degrees Celsius.

16. The method of claim 13, wherein the thermal process is conducted for about 10 to 30 minutes.

17. The method of claim 13, wherein the substrate that is being consumed during the reaction between the doped layer and the substrate is about 180 angstroms to about 220 angstroms thick.

18. The method of claim 13, wherein the passivation layer is formed with a material that comprises silicon nitride.

19. The method of claim 13, wherein the passivation layer is about 150 angstroms to about 200 angstroms thick.

20. The method of claim 13, wherein the doped layer comprises a silicate glass layer doped with arsenic ions.

* * * * *